United States Patent
Nakamura et al.

(10) Patent No.: US 12,342,606 B2
(45) Date of Patent: Jun. 24, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Hiroyuki Nakamura, Fukuoka (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 98 days.

(21) Appl. No.: 18/062,475

(22) Filed: Dec. 6, 2022

(65) Prior Publication Data

US 2023/0106654 A1 Apr. 6, 2023

Related U.S. Application Data

(62) Division of application No. 16/875,457, filed on May 15, 2020, now Pat. No. 11,610,882, which is a
(Continued)

(30) Foreign Application Priority Data

Apr. 24, 2017 (JP) .................................. 2017-085001

(51) Int. Cl.
*H10D 84/40* (2025.01)
*H10D 8/01* (2025.01)
(Continued)

(52) U.S. Cl.
CPC ........... *H10D 84/403* (2025.01); *H10D 8/045* (2025.01); *H10D 12/032* (2025.01);
(Continued)

(58) Field of Classification Search
CPC ............. H01L 27/0635; H01L 27/0727; H01L 29/0607; H01L 29/0649; H01L 29/66136;
(Continued)

(56) References Cited

U.S. PATENT DOCUMENTS 7,705,398 B2 4/2010 Kaneda et al.
7,768,101 B2 8/2010 Suzuki et al.
(Continued)

FOREIGN PATENT DOCUMENTS

CN 101026161 A 8/2007
CN 103681665 A 3/2014
(Continued)

OTHER PUBLICATIONS

An Office Action mailed by China National Intellectual Property Administration on Jan. 18, 2023, which corresponds to Chinese Patent Application No. 201810373333.7 and is related to U.S. Appl. No. 18/062,475; with English language translation.
(Continued)

*Primary Examiner* — Bitew A Dinke
(74) *Attorney, Agent, or Firm* — Studebaker Brackett PLLC

(57) ABSTRACT

A semiconductor device includes a semiconductor substrate in which a first region having a freewheeling diode arranged therein, second regions having an IGBT arranged therein, and a withstand-voltage retention region surrounding the first region and the second regions in plan view are defined. The semiconductor substrate has a first main surface and a second main surface. The semiconductor substrate includes an anode layer having a first conductivity type, which is arranged in the first main surface of the first region, and a diffusion layer having the first conductivity type, which is arranged in the first main surface of the withstand-voltage retention region adjacently to the anode layer. A first trench
(Continued)

is arranged in the first main surface on a side of the anode layer with respect to a boundary between the anode layer and the diffusion layer.

6 Claims, 5 Drawing Sheets

Related U.S. Application Data division of application No. 15/851,447, filed on Dec. 21, 2017, now abandoned.

(51) Int. Cl.
| | |
|---|---|
| *H10D 12/00* | (2025.01) |
| *H10D 12/01* | (2025.01) |
| *H10D 62/10* | (2025.01) |
| *H10D 84/80* | (2025.01) |
| H10D 8/00 | (2025.01) |
| H10D 62/13 | (2025.01) |
| H10D 62/17 | (2025.01) |
| H10D 62/60 | (2025.01) |
| H10D 62/83 | (2025.01) |
| H10D 62/832 | (2025.01) |
| H10D 62/85 | (2025.01) |

(52) U.S. Cl.
CPC ......... *H10D 12/441* (2025.01); *H10D 62/102* (2025.01); *H10D 62/115* (2025.01); *H10D 84/811* (2025.01); *H10D 8/00* (2025.01); *H10D 62/124* (2025.01); *H10D 62/133* (2025.01); *H10D 62/137* (2025.01); *H10D 62/177* (2025.01); *H10D 62/393* (2025.01); *H10D 62/60* (2025.01); *H10D 62/8303* (2025.01); *H10D 62/8325* (2025.01); *H10D 62/8503* (2025.01)

(58) Field of Classification Search
CPC ........... H01L 29/66333; H01L 29/7395; H01L 29/0684; H01L 29/0804; H01L 29/0821; H01L 29/1004; H01L 29/1095; H01L 29/1602; H01L 29/1608; H01L 29/2003; H01L 29/36; H01L 29/861; H01L 29/0615; H01L 29/4238; H01L 29/0696; H01L 29/0834; H01L 29/402; H01L 21/82; H01L 29/0657
See application file for complete search history.

(56) References Cited

U.S. PATENT DOCUMENTS

| | | | |
|---|---|---|---|
| 7,847,345 B2 | 12/2010 | Takahashi | |
| 8,507,352 B2 | 8/2013 | Koyama et al. | |
| 9,972,675 B1 | 5/2018 | Soneda | |
| 11,610,882 B2* | 3/2023 | Nakamura | H01L 29/0696 |
| 2002/0153586 A1 | 10/2002 | Majumdar et al. | |
| 2006/0131685 A1 | 6/2006 | Watanabe et al. | |
| 2007/0200138 A1* | 8/2007 | Ozeki | H01L 27/0611 |
| | | | 257/E29.328 |
| 2008/0230810 A1* | 9/2008 | Yoshimura | H01L 29/7811 |
| | | | 257/256 |
| 2009/0001411 A1 | 1/2009 | Tokura et al. | |
| 2009/0242931 A1* | 10/2009 | Tsuzuki | H01L 29/167 |
| | | | 257/143 |
| 2010/0140658 A1* | 6/2010 | Koyama | H01L 29/7397 |
| | | | 257/E21.705 |
| 2011/0006338 A1 | 1/2011 | Senoo | |
| 2011/0204469 A1 | 8/2011 | Onishi | |
| 2011/0233714 A1* | 9/2011 | Lu | H01L 29/66348 |
| | | | 257/493 |
| 2011/0285427 A1* | 11/2011 | Koyama | H01L 24/73 |
| | | | 257/E29.198 |
| 2012/0043581 A1 | 2/2012 | Koyama et al. | |
| 2013/0001639 A1 | 1/2013 | Iwasaki et al. | |
| 2013/0009205 A1 | 1/2013 | Tsuzuki et al. | |
| 2013/0248924 A1 | 9/2013 | Matsudai et al. | |
| 2014/0084337 A1 | 3/2014 | Matsudai et al. | |
| 2014/0197451 A1* | 7/2014 | Chen | H01L 29/1095 |
| | | | 257/139 |
| 2014/0306267 A1 | 10/2014 | Kameyama | |
| 2014/0361333 A1 | 12/2014 | Kimura et al. | |
| 2014/0374871 A1 | 12/2014 | Hirabayashi et al. | |
| 2015/0014741 A1* | 1/2015 | Chen | H01L 29/404 |
| | | | 257/139 |
| 2015/0028382 A1* | 1/2015 | Von Arx | H01L 29/0804 |
| | | | 257/139 |
| 2015/0054118 A1 | 2/2015 | Senoo | |
| 2015/0155277 A1 | 6/2015 | Ogura et al. | |
| 2015/0162423 A1* | 6/2015 | Lee | H01L 29/7397 |
| | | | 438/135 |
| 2015/0255535 A1 | 9/2015 | Taguchi et al. | |
| 2015/0279931 A1* | 10/2015 | Chen | H01L 29/0619 |
| | | | 257/495 |
| 2015/0349144 A1* | 12/2015 | Kawano | H01L 29/0619 |
| | | | 257/494 |
| 2016/0043073 A1 | 2/2016 | Tamura et al. | |
| 2016/0141400 A1* | 5/2016 | Takahashi | H01L 29/7391 |
| | | | 257/140 |
| 2016/0163696 A1* | 6/2016 | Takahashi | H01L 29/1095 |
| | | | 257/140 |
| 2016/0260703 A1* | 9/2016 | Nakamura | H01L 29/0696 |
| 2016/0260707 A1* | 9/2016 | Yasuda | H01L 29/0619 |
| 2016/0372584 A1 | 12/2016 | Kimura et al. | |
| 2017/0069625 A1 | 3/2017 | Hirabayashi et al. | |
| 2017/0084610 A1 | 3/2017 | Kouno | |
| 2017/0148785 A1 | 5/2017 | Hirabayashi | |
| 2017/0236908 A1* | 8/2017 | Naito | H01L 29/32 |
| | | | 257/48 |
| 2017/0263603 A1* | 9/2017 | Hata | H01L 27/0727 |
| 2017/0294526 A1 | 10/2017 | Storasta et al. | |
| 2018/0076193 A1 | 3/2018 | Shirakawa et al. | |
| 2018/0108737 A1* | 4/2018 | Naito | H01L 29/8613 |
| 2018/0182754 A1 | 6/2018 | Naito | |
| 2018/0182844 A1 | 6/2018 | Nakamura | |
| 2018/0226400 A1* | 8/2018 | Shinsho | H01L 29/7396 |
| 2018/0233554 A1 | 8/2018 | Mitsuzuka et al. | |
| 2018/0248003 A1* | 8/2018 | Nakamura | H01L 29/0619 |
| 2018/0294259 A1* | 10/2018 | Sato | H01L 29/8611 |
| 2019/0019885 A1 | 1/2019 | Naito | |
| 2019/0096989 A1 | 3/2019 | Yoshida | |
| 2019/0157264 A1 | 5/2019 | Yoshida et al. | |

FOREIGN PATENT DOCUMENTS

| | | |
|---|---|---|
| CN | 106783849 A | 5/2017 |
| EP | 1811572 A2 | 7/2007 |
| JP | 2004-363327 A | 12/2004 |
| JP | 2006-173437 A | 6/2006 |
| JP | 2008-053648 A | 3/2008 |
| JP | 2008103590 A | 5/2008 |
| JP | 2008109028 A | 5/2008 |
| JP | 2011-204710 A | 10/2011 |
| JP | 2013-026534 A | 2/2013 |
| JP | 2013-152996 A | 8/2013 |
| JP | 2014-103376 A1 | 6/2014 |
| JP | 2016-219772 A | 12/2016 |
| JP | 2017-098344 A | 6/2017 |
| WO | 2014/054319 A | 4/2014 |

OTHER PUBLICATIONS

An Office Action mailed by the Japanese Patent Office on Apr. 7, 2020, which corresponds to Japanese Patent Application No. 2017-085001 and is related to U.S. Appl. No. 15/851,447; with English language translation.

(56) References Cited

OTHER PUBLICATIONS

An Office Action mailed by the Japanese Patent Office on Oct. 23, 2019, which corresponds to Japanese Patent Application No. 2017-085001 and is related to U.S. Appl. No. 15/851,447.
H. Takahashi et al., "1200V Reverse Conducting IGBT," Proceedings of 2004 International Symposium on Power Semiconductor Devices & ICs, Kitakyushu, pp. 133-136.
An Office Action; "Notice of Reasons for Refusal," mailed by the Japanese Patent Office on Nov. 4, 2020, which corresponds to Japanese Patent Application No. 2019-217895 and is related to U.S. Appl. No. 16/875,457 with English language translation.
An Office Action issued by the German Patent Office on Nov. 17, 2021, which corresponds to German Patent Application No. 10 2018 200 136.7 and is related to U.S. Appl. No. 16/875,457 with English language translation.
An Office Action mailed by China National Intellectual Property Administration on Jun. 29, 2022, which corresponds to Chinese Patent Application No. 201810373333.7 and is related to U.S. Appl. No. 16/875,457 with English language translation.
Decision of Refusal mailed by China National Intellectual Property Administration on Apr. 28, 2023, which corresponds to Chinese Patent Application No. 201810373333.7 and is related to U.S. Appl. No. 18/062,475; with English language translation.

* cited by examiner

SEMICONDUCTOR DEVICE AND METHOD OF MANUFACTURING SEMICONDUCTOR DEVICE

CROSS-REFERENCE TO RELATED APPLICATIONS

This application is a Divisional of U.S. patent application Ser. No. 16/875,457 filed on May 15, 2020 which is a Divisional of U.S. patent application Ser. No. 15/851,447 filed on Dec. 21, 2017, which claims benefit of priority to Japanese Patent Application No. 2017-085001 filed Apr. 24, 2017, the entire content of which is incorporated herein by reference.

FIELD OF THE INVENTION

The present invention relates to a semiconductor device such as a power semiconductor device and a method of manufacturing the semiconductor device.

Description of the Background Art

A power device as a power semiconductor device is used in a wide range of fields such as the fields of home electronic appliances, electric vehicles, and railroads and the fields of solar photovoltaic power generation and wind power generation that have been attracting more attention as power generation of renewable energy. In those fields, an inductive load of an induction motor or the like is driven by an inverter circuit constructed by a power device in many cases. In a configuration of driving an inductive load, a freewheeling diode (hereinafter referred to as an "FWD") for circulating a current generated due to a counter-electromotive force of an inductive load is provided. Note that, a typical inverter circuit is formed of a plurality of insulated gate bipolar transistors (hereinafter referred to as "IGBTs") and a plurality of FWDs.

However, the inverter circuit is largely desired to be reduced in size, weight, and cost, and thus it is not desirable to mount a plurality of IGBTs and a plurality of FWDs on the inverter circuit individually. As one countermeasure thereof, an IGBT of a reverse conducting type (hereinafter referred to as an "RC-IGBT") that integrates the IGBT and the FWD has been developed, and the configuration with the above applied thereto enables reduction of the mounting area of the semiconductor device and reduction in cost.

In the RC-IGBT, a p-type collector layer as an IGBT and an n-type cathode layer as an FWD are arranged in a surface only having arranged therein a p-type collector layer of a typical IGBT that does not have reverse conducting property. Further, in a surface opposite to such a surface of the RC-IGBT, a p-type base layer as the IGBT, a p-type anode layer as the FWD, and a p-type diffusion layer of a withstand-voltage retention region surrounding those layers in plan view are arranged. Note that, the RC-IGBT is disclosed in, for example, Takahashi H, et al, "1200V Reverse Conducting IGBT", Proceedings of ISPSD, 2004, p. 133-136, Japanese Patent Application Laid-Open No. 2008-53648, Japanese Patent Application Laid-Open No. 2008-103590, and Japanese Patent Application Laid-Open No. 2008-109028.

However, in the RC-IGBT, a recovery current being an opposite current to a current usually supposed to flow as a diode (forward current) flows when the FWD is turned into an off state from an on state, and there has been a problem in that the recovery current becomes a cause of energy loss.

SUMMARY

The present invention is made in view of the problems as described above, and has an object to provide a technology capable of reducing a recovery current.

The present invention provides a semiconductor device including a semiconductor substrate, a surface electrode, and a back-surface electrode. The semiconductor substrate has a first main surface and a second main surface, and a first region having a freewheeling diode arranged therein, second regions having an insulated gate bipolar transistor (IGBT) arranged therein, and a withstand-voltage retention region surrounding the first region and the second regions in plan view are defined in the semiconductor substrate. The surface electrode is arranged on the first main surface of the first region, of the second regions, and of the withstand-voltage retention region. The back-surface electrode is arranged on the second main surface of the first region, of the second regions, and of the withstand-voltage retention region. The semiconductor substrate includes an anode layer having a first conductivity type, a diffusion layer having the first conductivity type, and a cathode layer having a second conductivity type. The anode layer is arranged in the first main surface of the first region. The diffusion layer is arranged in the first main surface of the withstand-voltage retention region adjacently to the anode layer. The cathode layer is arranged in the second main surface of the first region. A first trench is arranged in the first main surface on a side of the anode layer with respect to a boundary between the anode layer and the diffusion layer.

According to the present invention, the first trench is arranged in the first main surface on the side of the anode layer with respect to the boundary between the anode layer and the diffusion layer. With this, it is possible to reduce the recovery current.

These and other objects, features, aspects and advantages of the present invention will become more apparent from the following detailed description of the present invention when taken in conjunction with the accompanying drawings.

DESCRIPTION OF THE PREFERRED EMBODIMENTS

<Related Semiconductor Device>

First, prior to giving description of a semiconductor device according to preferred embodiments of the present invention, a power semiconductor device related thereto (hereinafter referred to as a "related semiconductor device") is described.

Figure 9:
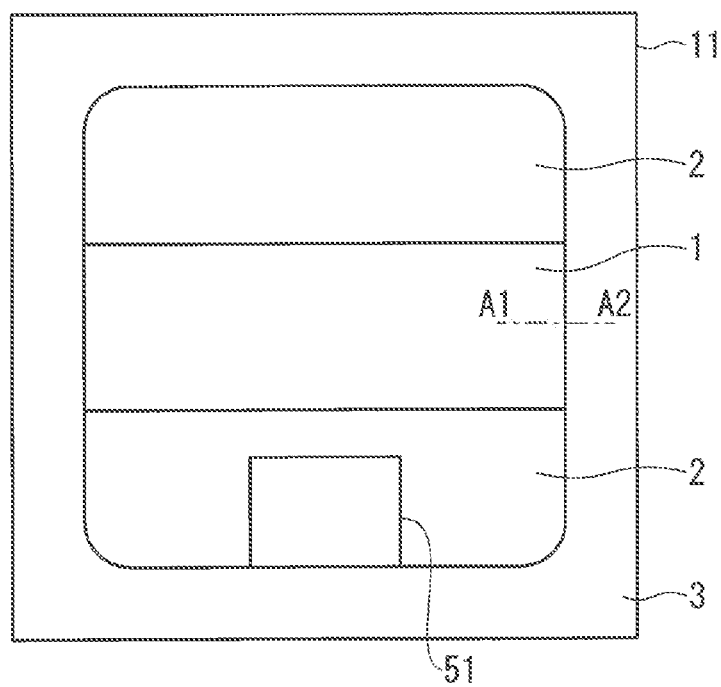
FIG. 9 is a plan view for illustrating configuration of a related semiconductor device.
Figure 10:
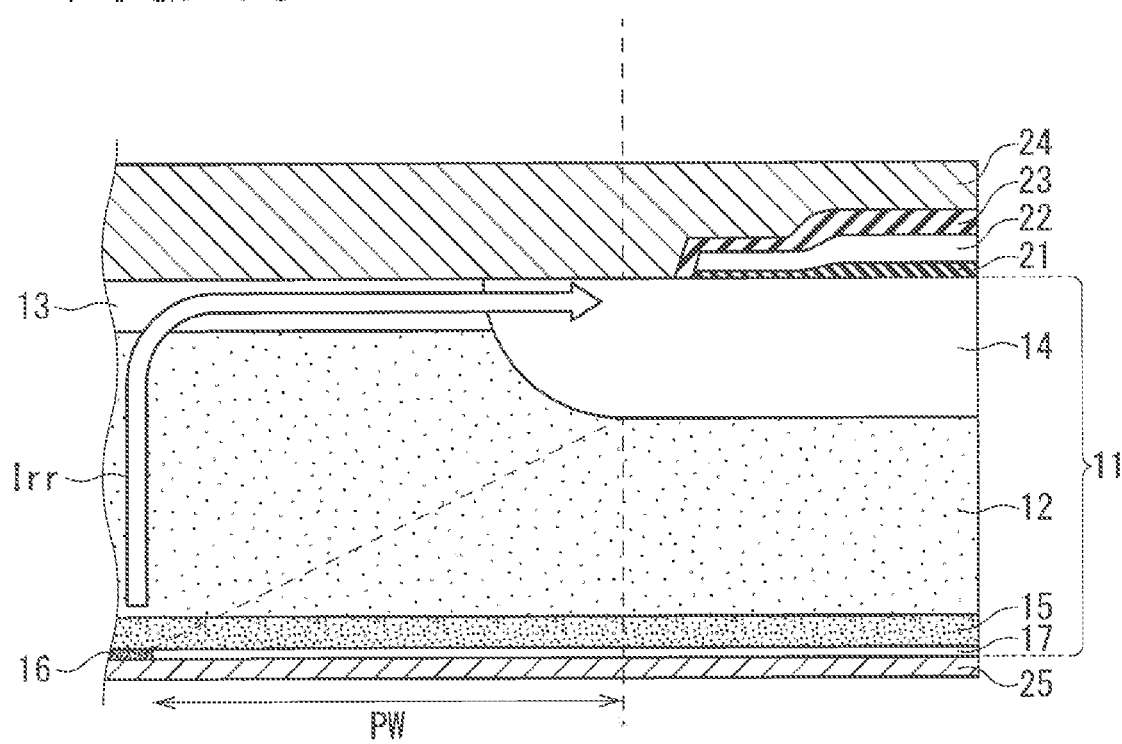
FIG. 10 is a sectional view for illustrating the configuration of the related semiconductor device.

FIG. 9 is a plan view for illustrating configuration of a related semiconductor device, and FIG. 10 is a sectional view for illustrating the configuration taken along the line A1-A2 of FIG. 9.

As illustrated in FIG. 9, the related semiconductor device includes a semiconductor substrate 11 in which an FWD region 1 being a first region having an FWD arranged therein, IGBT regions 2 each being a second region having an IGBT arranged therein, and a withstand-voltage retention region 3 are defined. The two IGBT regions 2 interpose the FWD region 1 therebetween in plan view, and the withstand-voltage retention region 3 surrounds the FWD region 1 and the two IGBT regions 2 in plan view. Further, the related semiconductor device includes a gate pad 51 arranged in the IGBT region 2.

Description is hereinafter given assuming that a first conductivity type is an n-type and a second conductivity type is a p-type. Further, description is hereinafter given assuming that a first main surface of the semiconductor substrate 11 is an upper surface of the semiconductor substrate 11 of FIG. 10, which encompasses each upper surface of the FWD region 1, the IGBT regions 2, and the withstand-voltage retention region 3, and that a second main surface of the semiconductor substrate 11 is a lower surface of the semiconductor substrate 11 of FIG. 10, which encompasses each lower surface of the FWD region 1, the IGBT regions 2, and the withstand-voltage retention region 3.

As illustrated in FIG. 10, the semiconductor substrate 11 of the related semiconductor device includes an n-type drift layer 12, a p-type anode layer 13, a first p-type diffusion layer 14 being a diffusion layer, an n-type buffer layer 15, an n-type cathode layer 16, and a second p-type diffusion layer 17. Further, although not shown, the semiconductor substrate 11 includes components of an IGBT such as an n-type emitter layer, a p-type base layer, and a p-type collector layer, for example.

The n-type drift layer 12 has relatively low n-type impurity concentration, and is arranged across the FWD region 1, the IGBT regions 2, and the withstand-voltage retention region 3.

The p-type anode layer 13 of the FWD is arranged in the upper surface of the FWD region 1, and is arranged on an upper surface of the n-type drift layer 12.

The n-type emitter layer and the p-type base layer of the IGBT (not shown) are arranged in the upper surface of the IGBT region 2, and are arranged on the upper surface of the n-type drift layer 12. Those n-type emitter layer and p-type base layer form a metal oxide semiconductor field effect transistor (MOSFET) being a part of the IGBT. Further, the p-type base layer of the IGBT is arranged adjacently to the p-type anode layer 13 of the FWD.

The first p-type diffusion layer 14 is arranged in the upper surface of the withstand-voltage retention region 3, and is arranged on the upper surface of the n-type drift layer 12. Further, the first p-type diffusion layer 14 is arranged adjacently to the p-type anode layer 13 of the FWD. Further, p-type impurity concentration of the first p-type diffusion layer 14 is higher than the impurity concentration of the p-type anode layer 13, and the first p-type diffusion layer 14 is deeper than the impurity of the p-type anode layer 13. Note that, a boundary between the first p-type diffusion layer 14 and the p-type anode layer 13 corresponds to a boundary between the withstand-voltage retention region 3 and the FWD region 1, and the vertically extending dotted line illustrated in FIG. 10 indicates a boundary of an injection region at the time of forming the first p-type diffusion layer 14, that is, a boundary between a mask and an opening region.

The n-type buffer layer 15 is arranged in the lower surfaces of the FWD region 1, the IGBT regions 2, and the withstand-voltage retention region 3, and is arranged on a lower surface of the n-type drift layer 12. N-type impurity concentration of the n-type buffer layer 15 is higher than the impurity concentration of the n-type drift layer 12.

The n-type cathode layer 16 of the FWD is arranged in the lower surface of the FWD region 1, and is arranged on a lower surface of the n-type buffer layer 15. N-type impurity concentration of the n-type cathode layer 16 is higher than the impurity concentration of the n-type buffer layer 15.

The p-type collector layer of the IGBT is arranged in the lower surface of the IGBT region 2, and is arranged on the lower surface of the n-type buffer layer 15. Further, the p-type collector layer of the IGBT is arranged adjacently to the n-type cathode layer 16 of the FWD.

The second p-type diffusion layer 17 is arranged in the lower surface of the withstand-voltage retention region 3, and is arranged on the lower surface of the n-type buffer layer 15. Further, the second p-type diffusion layer 17 is arranged adjacently to the n-type cathode layer 16 of the FWD. In the related semiconductor device, an end portion of the second p-type diffusion layer 17 on the FWD region 1 side protrudes to the FWD region 1. A length PW between the end portion of the second p-type diffusion layer 17 on the FWD region 1 side and the vertically extending dotted line illustrated in FIG. 10 is set to be larger than a thickness of a portion of the n-type drift layer 12 below the first p-type diffusion layer 14. With this, it is possible to prevent carriers from reaching the n-type cathode layer 16 from the first p-type diffusion layer 14 passing through the n-type drift layer 12. Note that, the second p-type diffusion layer 17 forms a field limiting ring (FLR) structure, a reduced surface field (RESURF) structure, or the like. However, description of the detailed configuration thereof is herein omitted.

The related semiconductor device includes, in addition to the above-mentioned semiconductor substrate 11, interlayer insulation films 21 and 23, a gate electrode layer 22 formed of polysilicon, a surface electrode 24, and a back-surface electrode 25.

The interlayer insulation film 21 is arranged in an end portion of the semiconductor substrate 11. The gate electrode layer 22 is arranged on the interlayer insulation film 21, and the interlayer insulation film 23 covers the gate electrode layer 22.

The surface electrode 24 is arranged on the upper surfaces of the FWD region 1, of the IGBT regions 2, and of the withstand-voltage retention region 3, and is electrically coupled to the gate pad 51 of FIG. 9. The back-surface electrode 25 is arranged on the lower surfaces of the FWD region 1, of the IGBT regions 2, and of the withstand-voltage retention region 3.

The related semiconductor device configured as described above functions as an RC-IGBT. Specifically, in a case where the IGBT is in an on state, a current flows from the p-type collector layer toward the n-type emitter layer (current from the lower side toward the upper side in FIG. 10). In a case where the IGBT is turned into an off state from the on state, a reverse voltage is applied to the RC-IGBT due to an inductive load (not shown) coupled to the RC-IGBT. As a result, the surface electrode 24 side has a high potential to turn the FWD into the on state, causing a current to flow from the p-type anode layer 13 toward the n-type cathode layer 16 (current from the upper side toward the lower side in FIG. 10), that is, causing a current to flow in a reverse direction to the case where the IGBT is in the on state. The reverse voltage is released in such a manner, thereby preventing a failure caused by the reverse voltage and effectively utilizing the reverse voltage in the inductive load.

Next, when the FWD is switched to the off state from the on state, which is caused by the IGBT being switched to the on state from the off state, a recovery current adversely continues to flow awhile in a reverse direction to the current having flowed when the FWD is in the on state, due to carriers such as holes of the p-type anode layer 13 that have been injected. The recovery current is in the same direction as the current that is supposed to flow in the RC-IGBT in a case where the IGBT is in the on state, thus being a cause of energy loss.

Particularly, in the above-mentioned related semiconductor device, the first p-type diffusion layer 14 having comparatively high concentration is arranged adjacently to the p-type anode layer 13. With such a configuration, when the IGBT is switched to the on state from the off state and the FWD is switched to the off state from the on state, holes are injected into the p-type anode layer 13 from the first p-type diffusion layer 14. As a result, holes that are supposed to be discharged increase, and thus a current in a reverse direction to a moving direction of the holes, that is, a recovery current indicated by an arrow Irr of FIG. 10 adversely increases. As a countermeasure thereof, it is possible to reduce the recovery current by providing the second p-type diffusion layer 17 in the lower surface of the withstand-voltage retention region 3, or making the second p-type diffusion layer 17 to protrude to the FWD region 1. However, further reduction of the recovery current is desired. In view of the above, as in the description below, with a semiconductor device according to first to seventh preferred embodiments of the present invention, it is possible to reduce the recovery current.

First Preferred Embodiment

Figure 1:
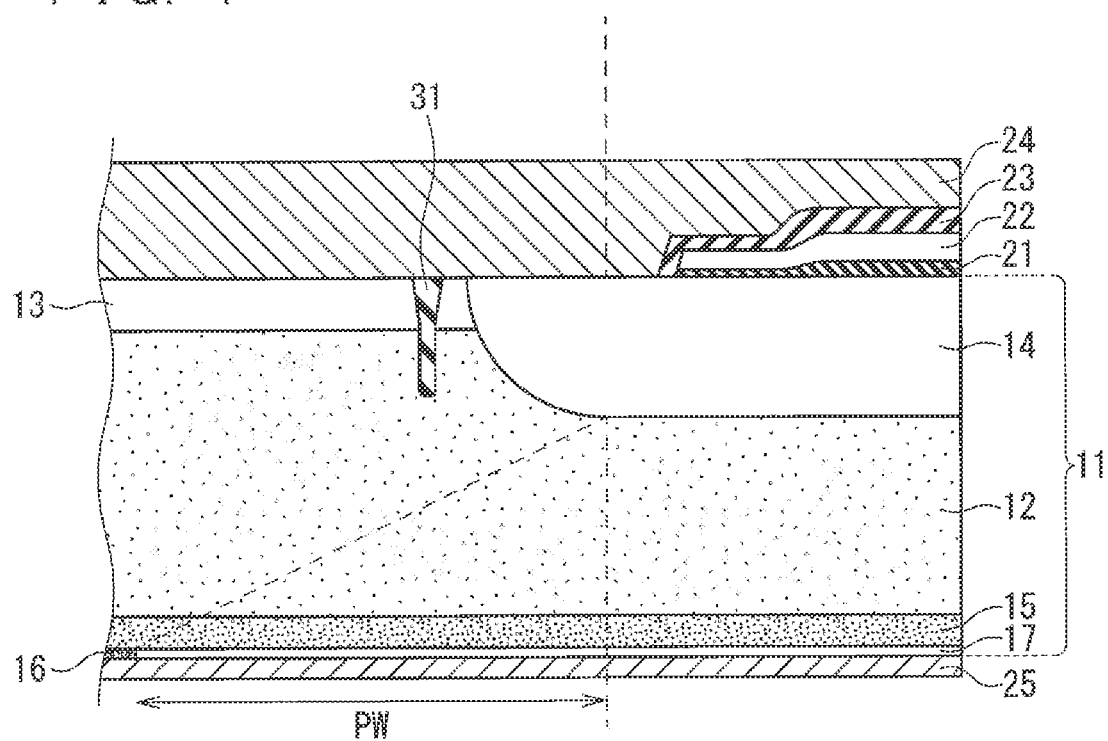
FIG. 1 is a sectional view for illustrating configuration of a semiconductor device according to a first preferred embodiment of the present invention.

FIG. 1 is a sectional view for illustrating configuration of a semiconductor device according to a first preferred embodiment of the present invention. In the following, out of components to be described in this first preferred embodiment, components that are the same or similar to the components already described in the related semiconductor device are denoted by the same reference symbols, and different components are mainly described.

As illustrated in FIG. 1, in a semiconductor device according to this first preferred embodiment, a first trench 31 is arranged in the upper surface of the semiconductor substrate 11 on a side of the p-type anode layer 13 with respect to the boundary between the p-type anode layer 13 and the first p-type diffusion layer 14. That is, the first trench 31 is not brought into contact with the first p-type diffusion layer 14, and is arranged in a portion of the p-type anode layer 13 on the first p-type diffusion layer 14 side. Note that, in this first preferred embodiment, the first trench 31 is formed similarly to a gate electrode structure (not shown) formed at least in the FWD region 1 and the IGBT regions 2. For this reason, inside the first trench 31, an electrode layer that is the same as the gate electrode layer is arranged with intermediation of an insulation film that is the same as the gate insulation film.

According to the semiconductor device of this first preferred embodiment as described above, when the FWD is switched to the off state from the on state, it is possible to prevent holes from being injected into the p-type anode layer 13 from the first p-type diffusion layer 14. As a result, it is possible to reduce the recovery current flowing from the first p-type diffusion layer 14 through intermediation of the p-type anode layer 13 to the n-type cathode layer 16.

Note that, in this first preferred embodiment, the semiconductor substrate 11 may be formed of a semiconductor such as silicon (Si), or may be formed of a wide-bandgap semiconductor such as silicon carbide (SiC), gallium nitride (GaN), and diamond. This is similarly applicable also in a second preferred embodiment and the following preferred embodiments of the present invention.

Second Preferred Embodiment

Figure 2:
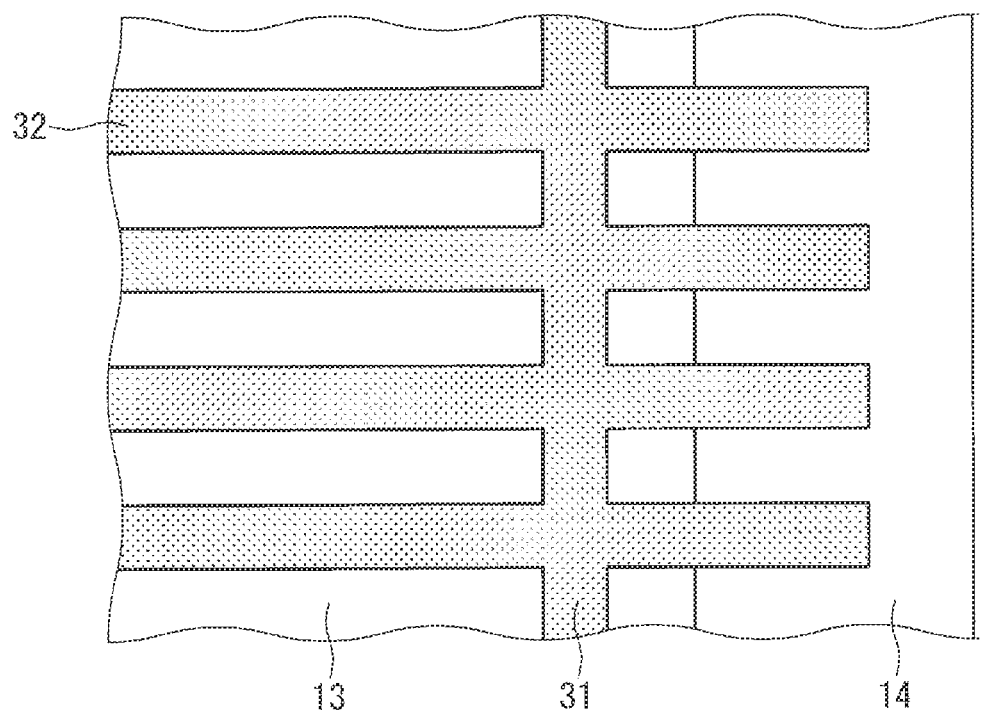
FIG. 2 is a plan view for illustrating configuration of the semiconductor device according to a second preferred embodiment of the present invention.

FIG. 2 is a plan view for illustrating configuration of the semiconductor device according to a second preferred embodiment of the present invention. In the following, out of components to be described in this second preferred embodiment, components that are the same or similar to the components already described in the related semiconductor device are denoted by the same reference symbols, and different components are mainly described.

As illustrated in FIG. 2, in the semiconductor device according to this second preferred embodiment, a second trench 32 crossing with the first trench 31 is arranged in the p-type anode layer 13. Note that, inside the second trench 32, similarly to the first trench 31, an electrode layer that is the same as the gate electrode layer is arranged with intermediation of an insulation film that is the same as the gate insulation film.

According to the semiconductor device of this second preferred embodiment as described above, an electric field concentrated on a lower side of the first trench 31 is dispersed on a lower side of the second trench 32. With this, it is possible to prevent an electric field from being concentrated in the trench, thereby being possible to enhance property of withstanding voltage and prevent deficiency of the trench.

Third Preferred Embodiment

Figure 3:
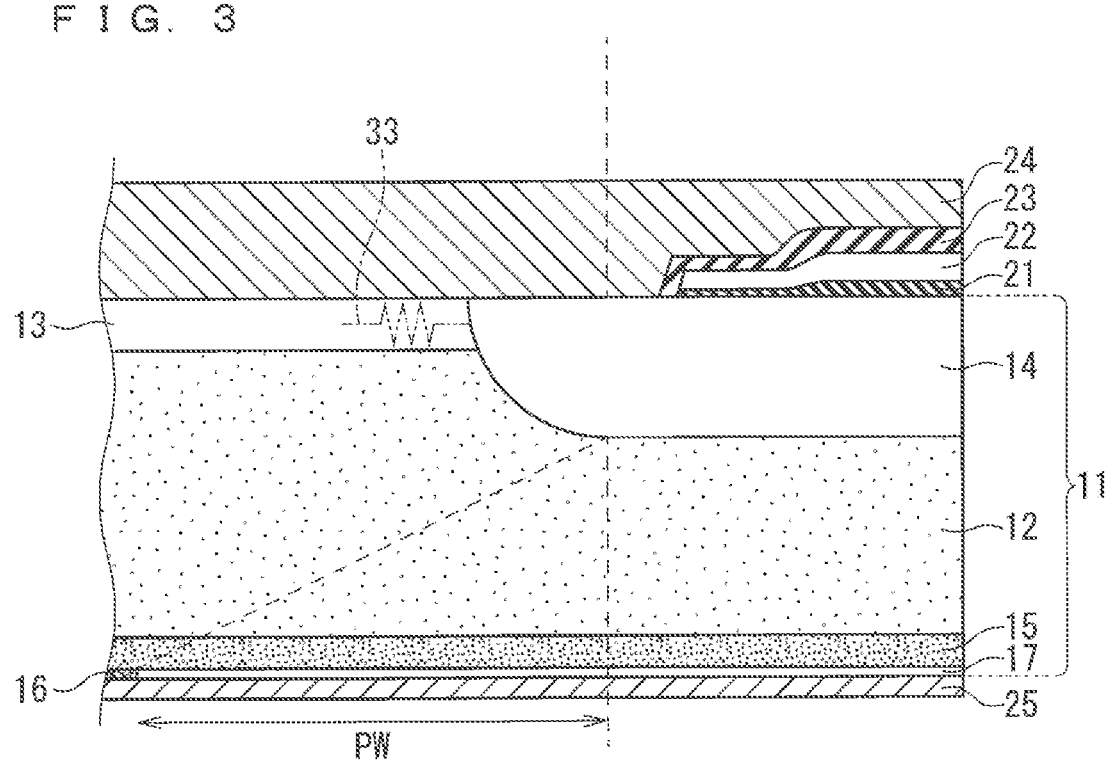
FIG. 3 is a sectional view for illustrating configuration of the semiconductor device according to a third preferred embodiment of the present invention.

FIG. 3 is a sectional view for illustrating configuration of the semiconductor device according to a third preferred embodiment of the present invention. In the following, out of components to be described in this third preferred embodiment, components that are the same or similar to the components already described in the related semiconductor device are denoted by the same reference symbols, and different components are mainly described.

In the semiconductor device according to this third preferred embodiment, p-type impurity concentration of the p-type anode layer 13 decreases as approaching to the first p-type diffusion layer 14. Note that, as a method of forming an impurity layer having concentration gradients to be the p-type anode layer 13, a commonly known method of variation of lateral doping (VLD) may be used, for example, or other methods may be used as well.

According to the semiconductor device of this third preferred embodiment as described above, the p-type anode layer 13 has concentration gradients, thereby being possible to raise resistance 33 between the p-type anode layer 13 and the first p-type diffusion layer 14 as indicated by the imaginary line of FIG. 3. With this, it is possible to reduce the recovery current flowing from the first p-type diffusion layer 14 through intermediation of the p-type anode layer 13 to the n-type cathode layer.

Fourth Preferred Embodiment

Figure 4:
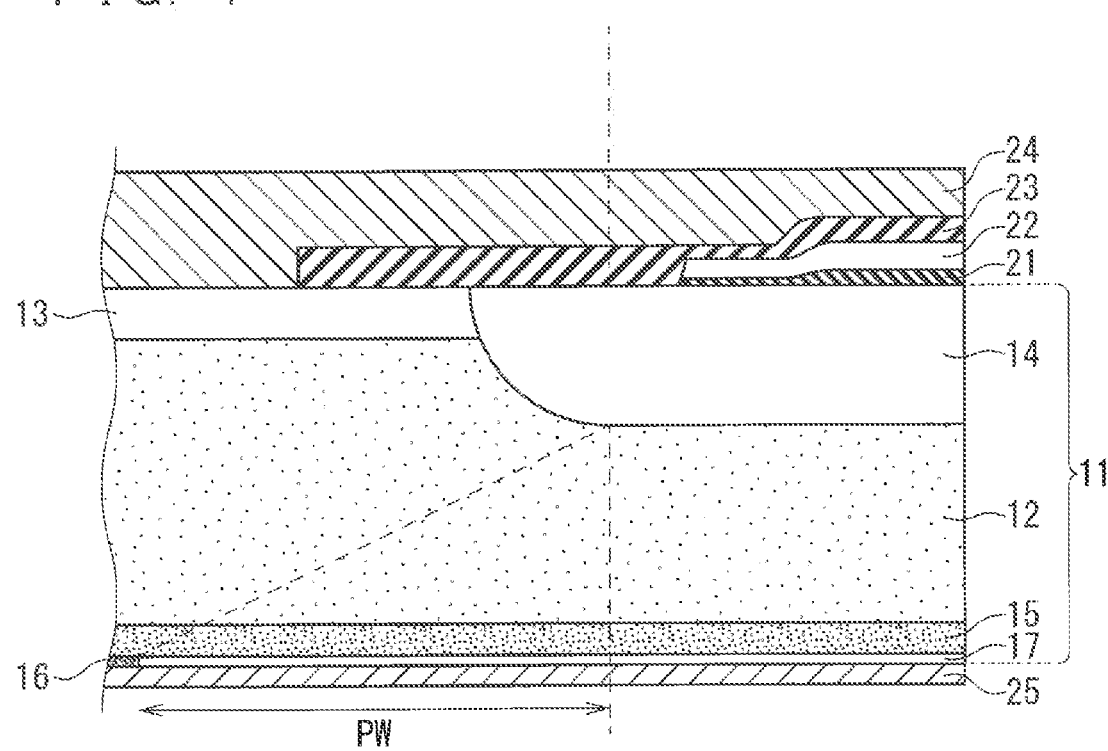
FIG. 4 is a sectional view for illustrating configuration of the semiconductor device according to a fourth preferred embodiment of the present invention.

FIG. 4 is a sectional view for illustrating configuration of the semiconductor device according to a fourth preferred embodiment of the present invention. In the following, out of components to be described in this fourth preferred embodiment, components that are the same or similar to the components already described in the related semiconductor device are denoted by the same reference symbols, and different components are mainly described.

As illustrated in FIG. 4, in the semiconductor device according to this fourth preferred embodiment, the surface electrode 24 is arranged on an upper side of the withstand-voltage retention region 3, and is out of contact with the first p-type diffusion layer 14. Here, an end portion of the interlayer insulation film 23 on the FWD region 1 side protrudes to the FWD region 1, and the surface electrode 24 and the first p-type diffusion layer 14 are separated apart by the protruding portion. Note that, the surface electrode 24 is arranged on the FWD region 1 and the IGBT regions 2, and is brought into contact with the p-type anode layer 13, the p-type base layer, and the n-type emitter layer.

According to the semiconductor device of this fourth preferred embodiment as described above, it is possible to prevent generation of holes being carriers in the first p-type diffusion layer 14 when the FWD is in the on state. For this reason, when the FWD is switched to the off state from the on state, it is possible to prevent the holes from being injected into the p-type anode layer 13 from the first p-type diffusion layer 14, thereby being possible to reduce the recovery current.

Fifth Preferred Embodiment

Figure 5:
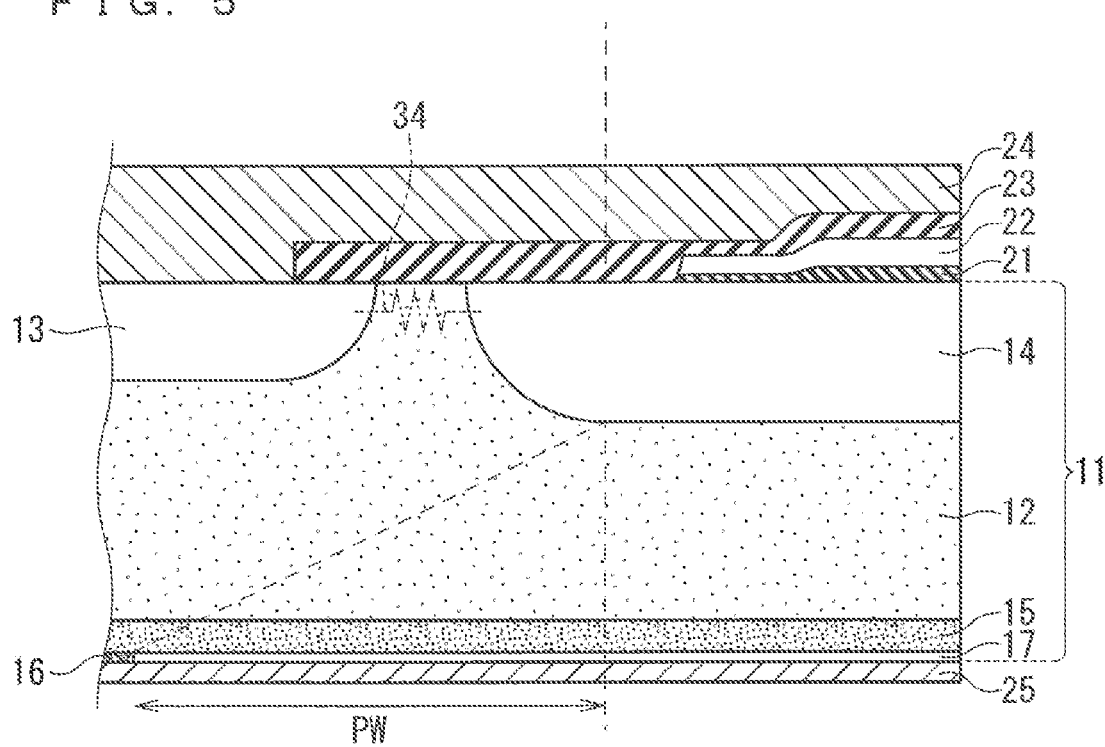
FIG. 5 is a sectional view for illustrating configuration of the semiconductor device according to a fifth preferred embodiment of the present invention.

FIG. 5 is a sectional view for illustrating configuration of the semiconductor device according to a fifth preferred embodiment of the present invention. In the following, out of components to be described in this fifth preferred embodiment, components that are the same or similar to the components already described in the semiconductor device according to the fourth preferred embodiment are denoted by the same reference symbols, and different components are mainly described.

As illustrated in FIG. 5, in the semiconductor device according to this fifth preferred embodiment, the p-type anode layer 13 and the first p-type diffusion layer 14 are separated apart by a portion of the n-type drift layer 12, and the portion of the n-type drift layer 12 is separated apart from the surface electrode 24 by the protruding portion of the interlayer insulation film 23.

According to the semiconductor device of this fifth preferred embodiment as described above, it is possible to raise resistance 34 between the p-type anode layer 13 and the first p-type diffusion layer 14 as indicated by the imaginary line of FIG. 5. With this, it is possible to reduce the recovery current flowing from the first p-type diffusion layer 14 through intermediation of the p-type anode layer 13 to the n-type cathode layer.

Sixth Preferred Embodiment

Figure 6:
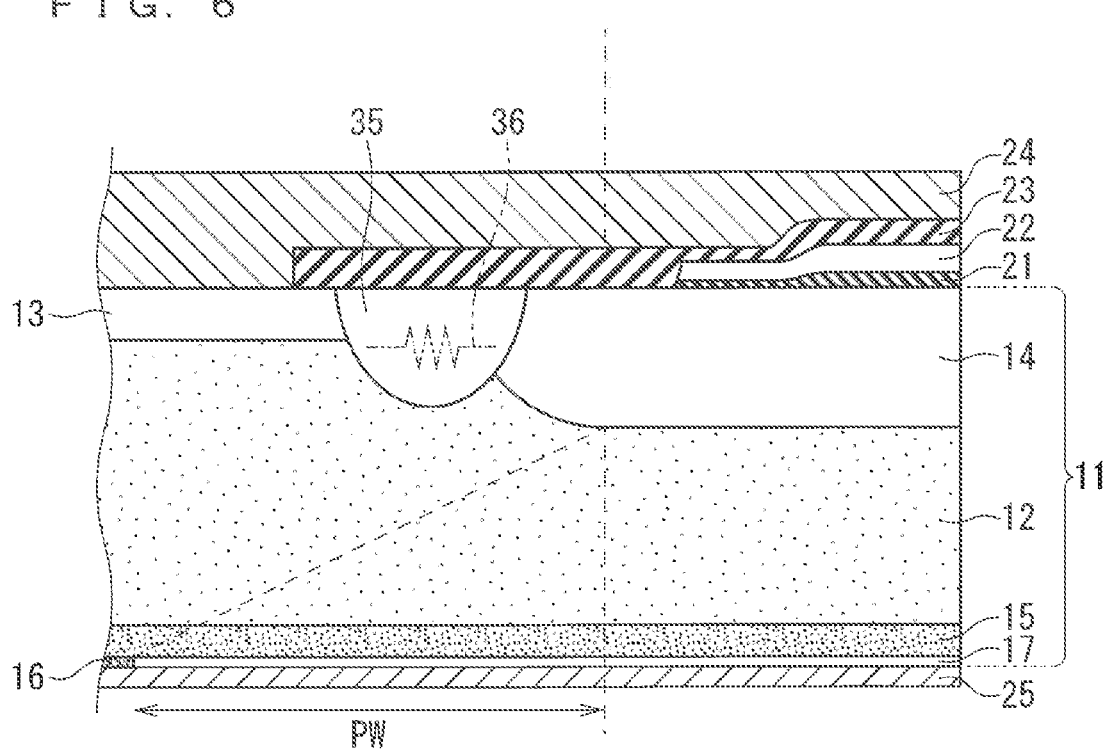
FIG. 6 is a sectional view for illustrating configuration of the semiconductor device according to a sixth preferred embodiment of the present invention.

FIG. 6 is a sectional view for illustrating configuration of the semiconductor device according to a sixth preferred embodiment of the present invention. In the following, out of components to be described in this sixth preferred embodiment, components that are the same or similar to the components already described in the semiconductor device according to the fourth preferred embodiment are denoted by the same reference symbols, and different components are mainly described.

As illustrated in FIG. 6, the semiconductor substrate 11 according to this sixth preferred embodiment further includes a separating region 35 having an n-type. The separating region 35 is interposed between the p-type anode layer 13 and the first p-type diffusion layer 14, and is arranged on the upper surface of the semiconductor substrate 11. An upper portion of the separating region 35 is separated apart from the surface electrode 24 by the protruding portion of the interlayer insulation film 23. Note that, in this sixth preferred embodiment, n-type impurity concentration of the separating region 35 is higher than the impurity concentration of the n-type drift layer 12.

According to the semiconductor device of this sixth preferred embodiment as described above, due to the formation of the separating region 35, manufacturing steps are increased in comparison to the fifth preferred embodiment. However, it is possible to cause a resistance value of resistance 36 between the p-type anode layer 13 and the first p-type diffusion layer 14 as partially indicated by the imaginary line of FIG. 6 to be an intended value. With this, it is possible to reduce the recovery current appropriately.

Seventh Preferred Embodiment

Figure 7:
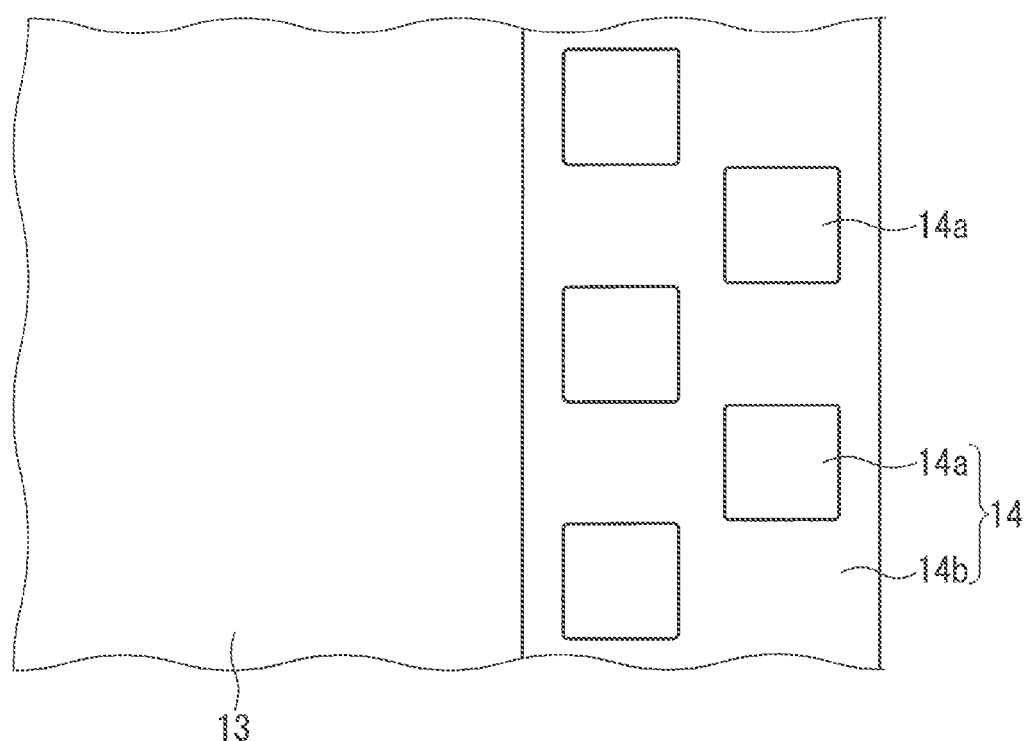
FIG. 7 is a plan view for illustrating configuration of the semiconductor device according to a seventh preferred embodiment of the present invention.
Figure 8:
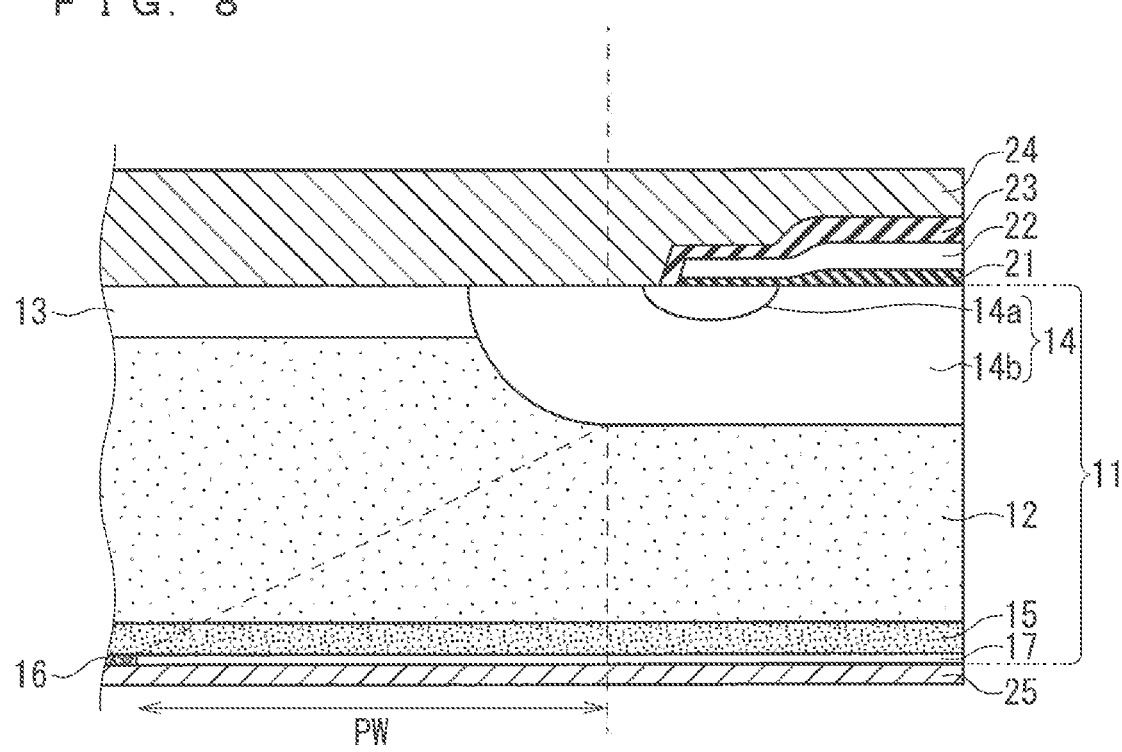
FIG. 8 is a sectional view for illustrating the configuration of the semiconductor device according to the seventh preferred embodiment.

FIG. 7 is a plan view for illustrating configuration of the semiconductor device according to a seventh preferred embodiment of the present invention, and FIG. 8 is a sectional view for illustrating the configuration. In the following, out of components to be described in this seventh preferred embodiment, components that are the same or similar to the components already described in the related semiconductor device are denoted by the same reference symbols, and different components are mainly described.

As illustrated in FIG. 7 and FIG. 8, in the semiconductor device according to this seventh preferred embodiment, the first p-type diffusion layer 14 includes a plurality of selective injection layers 14a and a semiconductor layer 14b having the plurality of selective injection layers 14a arranged therein. As illustrated in FIG. 7, the plurality of selective injection layers 14a of a quadrangular shape are arranged in a zigzag pattern along a circumferential direction of the withstand-voltage retention region 3, and as illustrated in FIG. 8, the selective injection layers 14a are arranged on an upper portion of the semiconductor layer 14b. Note that, shapes, positions, and ranges of the plurality of selective injection layers 14a are not limited to those illustrated in FIG. 7 and FIG. 8.

In this seventh preferred embodiment, the first p-type diffusion layer 14 is formed in such a manner that impurity is selectively injected within a region in which the first p-type diffusion layer 14 is to be formed. With this, impurity is injected into the plurality of selective injection layers 14a, but impurity is not injected into the semiconductor layer 14b. However, the impurity of the plurality of selective injection layers 14a is diffused to the semiconductor layer 14b due to thermal diffusion or the like. For this reason, generally, the impurity concentration of the semiconductor layer 14b is lower than the impurity concentration of the selective injection layers 14a. Note that, change in impurity concentration along a direction from one of the selective injection layers 14a and the semiconductor layer 14b to another may be steep or may be gentle. In this seventh preferred embodiment configured as described above, the first p-type diffusion layer 14 has uneven impurity concentration.

According to the semiconductor device of this seventh preferred embodiment as described above, it is possible to have mean impurity concentration in the entire first p-type diffusion layer 14 lower than the impurity concentration of the selective injection layers 14a. With this, it is possible to prevent the generation of the holes in the first p-type diffusion layer 14 when the FWD is in the on state, thereby being possible to reduce the recovery current.

Note that, in the present invention, each of the preferred embodiments and each of the modified examples may be freely combined, and each of the preferred embodiments and each of the modified examples may be appropriately modified or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor substrate in which a first region having a freewheeling diode arranged therein, second regions having an insulated gate bipolar transistor (IGBT) arranged therein, and a withstand-voltage retention region surrounding said first region and said second regions in plan view are defined, said semiconductor substrate having a first main surface and a second main surface;
   a surface electrode arranged on said first main surface of a region that includes at least said first region and said withstand-voltage retention region; and
   a back-surface electrode arranged on said second main surface of a region that includes at least said first region and said withstand-voltage retention region,
   said semiconductor substrate further comprising:
      an anode layer having a first conductivity type, which is arranged in said first main surface of said first region;
      a diffusion layer having said first conductivity type, which is arranged in said first main surface of said withstand-voltage retention region;
      a drift layer having a second conductivity type;
      a separating region having a second conductivity type, which is interposed between said anode layer and said diffusion layer and is arranged in said first main surface, the separating region having an impurity concentration different from that of the drift layer; and
      a cathode layer having the second conductivity type, which is arranged in said second main surface of said first region.

2. The semiconductor device according to claim 1, wherein said semiconductor device further comprises an insulating layer to isolate between said surface electrode and said diffusion layer.

3. The semiconductor device according to claim 2, wherein said separating region is in direct contact with said insulating layer.

4. The semiconductor device according to claim 2, wherein said separating region is separated apart from the surface electrode by said insulating layer.

5. The semiconductor device according to claim 1, wherein said separating region is configured to raise resistance between the anode layer and the diffusion layer.

6. The semiconductor device according to claim 1, wherein the separating region has an impurity concentration higher than that of the drift layer.

* * * * *